US006770507B2

(12) United States Patent
Abe et al.

(10) Patent No.: US 6,770,507 B2
(45) Date of Patent: Aug. 3, 2004

(54) SEMICONDUCTOR WAFER AND METHOD FOR PRODUCING THE SAME

(75) Inventors: Takao Abe, Annaka (JP); Takashi Matsuura, Sendai (JP); Junichi Murota, Sendai (JP)

(73) Assignee: Shin-Etsu Handotai Co., LTD, Tokyo (JP)

( * ) Notice: Subject to any disclaimer, the term of this patent is extended or adjusted under 35 U.S.C. 154(b) by 0 days.

(21) Appl. No.: 09/926,190

(22) PCT Filed: Jan. 19, 2001

(86) PCT No.: PCT/JP01/00331

§ 371 (c)(1), (2), (4) Date: Sep. 20, 2001

(87) PCT Pub. No.: WO01/56085

PCT Pub. Date: Aug. 2, 2001

(65) Prior Publication Data

US 2002/0182827 A1 Dec. 5, 2002

(30) Foreign Application Priority Data

Jan. 25, 2000 (JP) ....................................... 2000-015756

(51) Int. Cl.$^{7}$ ..................... H01L 21/00; H01L 21/8238; H01L 21/76; H01L 21/30

(52) U.S. Cl. ......................... 438/64; 438/222; 438/406; 438/458

(58) Field of Search ................................ 438/458, 406, 438/222, 64

(56) References Cited

U.S. PATENT DOCUMENTS

| | | | | | |
|---|---|---|---|---|---|
| 5,013,681 | A | * | 5/1991 | Godbey et al. | 437/86 |
| 5,360,752 | A | * | 11/1994 | Brady et al. | 437/62 |
| 5,374,581 | A | * | 12/1994 | Ichikawa et al. | 437/62 |
| 5,494,846 | A | | 2/1996 | Yamazaki | |
| 5,670,411 | A | * | 9/1997 | Yonechara et al. | 437/62 |
| 5,953,622 | A | | 9/1999 | Lee et al. | |
| 6,146,979 | A | * | 11/2000 | Henley et al. | 438/458 |
| 6,211,041 | B1 | * | 4/2001 | Ogura | 438/458 |
| 6,221,738 | B1 | * | 4/2001 | Sakaguchi et al. | 438/455 |
| 6,222,253 | B1 | * | 4/2001 | Sadana et al. | 257/617 |
| 6,245,161 | B1 | * | 6/2001 | Henley et al. | 148/33.4 |
| 6,251,754 | B1 | * | 6/2001 | Ohshima et al. | 438/506 |
| 6,306,730 | B2 | * | 10/2001 | Mitani et al. | 438/458 |
| 6,309,945 | B1 | * | 10/2001 | Sato et al. | 438/409 |
| 6,323,108 | B1 | * | 11/2001 | Kub et al. | 438/458 |
| 6,323,109 | B1 | * | 11/2001 | Okonogi | 438/459 |
| 6,362,076 | B1 | * | 3/2002 | Inazuki et al. | 438/458 |
| 6,368,938 | B1 | * | 4/2002 | Usenko | 438/407 |
| 6,372,609 | B1 | * | 4/2002 | Aga et al. | 438/459 |

FOREIGN PATENT DOCUMENTS

EP 0 953 853 A2 11/1999

OTHER PUBLICATIONS

"Low–Loss Planar Optical Waveguides Fabricated in SIMOX Material," IEEE Photonics Technology Letters, vol. 4, No. 6, (Jun. 1992), pp. 633–635, A. Rickman et al.

"Electronics Letters," vol. 35, No. 12 (Jun. 10, 1999), pp. 977–978, T.W. Ang et al.

Abstract of Japanese Patent Publ. No. 05299345A; dated Nov. 12, 1993.

* cited by examiner

*Primary Examiner*—Long Pham
*Assistant Examiner*—Shrinivas H Rao
(74) *Attorney, Agent, or Firm*—Arent Fox, PLLC

(57) ABSTRACT

There is provided a novel bonded semiconductor wafer having a layered structure alternately stacked with semiconductor layers and insulator layers in two cycles or more and manufactured by means of a bonding process, wherein at least one of the insulator layers is formed with ion implanted oxygen, and a novel manufacturing process for a bonded semiconductor wafer in which an ion implantation separation process is adopted. The novel bonded semiconductor wafer is manufactured by means of a bonding process and has a layered structure alternately stacked with semiconductor layers and insulator layers in two cycles or more, wherein at least one of the insulator layers is formed with ion implanted oxygen.

5 Claims, 5 Drawing Sheets

SEMICONDUCTOR WAFER AND METHOD FOR PRODUCING THE SAME

TECHNICAL FIELD

The present invention relates to a bonded semiconductor wafer having a layered structure alternately stacked with semiconductor layers and insulator layers in two cycles or more and to a novel manufacturing process therefor.

BACKGROUND ART

In the technical progress in miniaturization of LSI (Large Scale Integrated circuit) devices in recent years, more perfect isolation, a higher operating speed and higher performance have been pursued and attention has been given to an SOI (Silicon-On-Insulator) wafer as material satisfying such demands.

There has been known a wafer bonding process as one of the manufacturing techniques for an SOI wafer. As a technique utilizing this bonding process, a so-called ion implantation separation process (also called a Smart-Cut (a registered trade mark) process) has been developed, which is described in JP A 93-211128.

This ion implantation separation process is a technique wherein an oxide film is formed on at least one of two silicon wafers, hydrogen gas ions or rare gas ions are implanted into one silicon wafer through an upper surface thereof to form a micro-bubble layer (an enclosed layer) within the interior of the one silicon wafer, thereafter the ion implanted surface is put into close contact with the other wafer with the oxide film interposed therebetween, then heat treatment (separation heat treatment) is applied to the wafers in close contact to separate the one wafer in such a manner that the contact portion is partly left in a state of a thin film at the micro-bubble layer performing as a cleavage plane (a separation plane), and heat treatment (bonding heat treatment) is further applied to the other wafer with the thin film left thereon to reinforce bonding between the surfaces in close contact and thereby manufacture an SOI wafer.

In this process, an SOI wafer is obtained with relative ease in which the separated surface is a good mirror surface and the SOI layer is very high in uniformity. This process is also advantageous in that a raw material can be effectively used since one wafer partly removed by separation can be reused. Furthermore, this process makes it possible that two silicon wafers can be bonded directly with each other without an oxide film interposed therebetween, not limited to the case where two silicon wafers are bonded together, the ion implanted silicon wafer is bonded to an insulator wafer having a different thermal expansion coefficient such as of quartz, silicon carbide and alumina, or by selecting a material other than silicon as a wafer to be ion implanted, a bonded wafer having a thin film of the material can be manufactured.

With the advent of the ion implantation separation process, there is solved a problem of film thickness uniformity which is the greatest problem in a bonded semiconductor wafer, and it has been possible to manufacture a bonded SOI wafer with a film thickness uniformity as excellent as 1 nm or less in film thickness standard deviation across a surface of the SOI layer. This process has made possible application of a bonded SOI wafer to an LSI such as a CMOS as a leading device, which requires an SOI layer in the form of an ultra-thin film and excellent film thickness uniformity, in addition to its conventional applications to a BiCMOS and a power IC.

While an SOI wafer to be used in the above-mentioned applications is of a structure including a single SOI layer formed on a buried oxide film, the applicant of the present application has proposed a technique in a previous application (JP A 99-316154) that the ion implantation separation process is adopted to form a bonded semiconductor wafer alternately stacked with two kinds of layers having different refractive indexes such as a combination of an SOI layer and a buried oxide film in two cycles or more and the bonded silicon wafer is utilized in an optical functional device.

This technique is to cultivate a field where the bonded semiconductor wafer is utilized in an optical functional device such as a waveguide, an optical communication modulator, an optical detector or a laser, and very useful. Especially, an SOI wafer having the simplest two cycle layered structure in such layered structures makes advantageously possible that an upper SOI layer is utilized in fabrication of an LSI while an lower SOI layer is utilized as an optical waveguide or a wiring layer, thereby facilitating three-dimensional wiring.

Description will be given of examples of prior art steps for manufacturing a bonded semiconductor wafer having a two cycle layered structure by use of the ion implantation separation process on the basis of FIGS. 4 and 5. FIG. 4 is a flow chart showing an example of a prior art manufacturing process for a bonded semiconductor wafer. FIG. 5 is a flow chart showing another example of a prior art manufacturing process for a bonded semiconductor wafer.

In FIG. 4, first of all, there are prepared a semiconductor wafer A having an insulator film or an insulator layer 10*a* on a surface thereof and a semiconductor wafer B having no insulator film on a surface thereof. Hydrogen (or rare gas) ions are implanted into the wafer A to form a micro-bubble layer 12*a* in the interior of the wafer A. The wafer A with the micro-bubble layer 12*a* is bonded to the wafer B with the insulator film 10*a* interposed therebetween at room temperature to form a bonded wafer 15.

When the bonded wafer 15 is heat treated, cracking occurs in the wafer A at the micro-bubble layer 12*a* due to strain to form an SOI wafer 16 with a one cycle layered structure in which the insulator layer 10*a* and a semiconductor layer 14*a* are formed on the wafer B. As opposed to the SOI wafer 16 with a one cycle layered structure, there is further prepared a wafer C having an insulator film or an insulator layer 10*b* on a surface thereof, hydrogen (or rare gas) ions are implanted into the wafer C to form a micro-bubble layer 12*b* in the interior of the wafer C. The wafer C with the micro-bubble layer 12*b* is bonded to the SOI wafer 16 at room temperature to form a bonded wafer 17.

When the bonded wafer 17 is heat treated, cracking occurs in the wafer C at the micro-bubble layer 12*b* to form an SOI wafer 18 with a two cycle layered structure in which the insulator layer 10*b* and the semiconductor layer 14*b* constituting the second cycle layered structure are formed on the first cycle layered structure (the insulator layer 10*a* and the semiconductor layer 14*a*) of the SOI wafer 16.

In another example of a prior art process shown in FIG. 5, a manufacturing process goes according to the same steps as in FIG. 4 till the first cycle layered structure is formed on a wafer B and as opposed to the SOI wafer 16 there is further prepared a wafer C having an insulator film or an insulator layer 10*b* on a surface thereof In this prior art example, hydrogen (or rare gas) ions are implanted into the SOI wafer 16 to form a micro-bubble layer 12*c* in the interior of the SOI wafer 16 instead of ion implantation on the wafer C in FIG. 4.

Then, the SOI wafer 16 is bonded to the wafer C with the insulator film 10*b* interposed therebetween at room temperature to form a bonded wafer 17. When the bonded wafer 17 is heat treated, cracking occurs in the wafer C due to strain at the micro-bubble layer 12*c*, and the insulator layer 10*b* and a semiconductor layer 14*c* are further formed in addition to the one cycle layered structure (the insulator layer 10*a* and the semiconductor layer 14*a*) of the SOI wafer 16 to complete an SOI wafer 18 having a two cycle layered structure.

As described above, in any of the manufacturing processes of FIGS. 4 and 5, there are necessarily repeated two times the hydrogen (or rare gas) ion implantation step and the bonding step, respectively. Furthermore, at least two heat treatment steps are required for separation heat treatment, and when separation heat treatment and bonding heat treatment are separately performed, further heat treatment steps are added.

In manufacturing the bonded semiconductor wafer having such a layered structure, however, there has to be repeated the bonding step requiring the severest process control for the purpose to improve the manufacture yield, so the manufacturing processes are neither simple nor convenient, resulting in high frequency in occurrence of defective products in the bonding steps.

DISCLOSURE OF THE INVENTION

The inventors have conducted earnest studies on a manufacturing process capable of manufacturing a bonded semiconductor wafer having a cyclically layered structure including semiconductor layers and insulator layers, and especially, a two cycle layered structure which is the simplest and most valuable in utilization among such cyclically layered structures, with more ease and further reduced frequency in occurrence of defective products, and as a result, have reached a conception that the number of bonding steps can be reduced by utilizing an oxide layer generated by oxygen ion implantation as an insulator layer, and completed the present invention on the basis of the conception.

With the above described problems in view, it is an object of the present invention to provide a novel bonded semiconductor wafer having a layered structure alternately stacked with semiconductor layers and insulator layers in two cycles or more and manufactured by means of a bonding process, wherein at least one of the insulator layers is formed with ion implanted oxygen, and a novel manufacturing process for a bonded semiconductor wafer in which an ion implantation separation process is adopted, and capable of simplifying a manufacturing procedure and reducing defective products in the bonding steps.

In order to solve the above described problem, a bonded semiconductor wafer of the present invention is manufactured by means of a bonding process and has a layered structure alternately stacked with semiconductor layers and insulator layers in two cycles or more, wherein at least one of the insulator layers is formed with ion implanted oxygen.

It is preferable that the semiconductor layers are of silicon and the insulator layers are of silicon oxide films, and the number of cycles of the layered structure is 2.

A first aspect of a manufacturing process for a bonded semiconductor wafer of the present invention comprises the steps of: preparing first and second semiconductor wafers on one or both of which an insulator film or insulator films are formed; implanting oxygen ions and hydrogen or rare gas ions into one surface of the first semiconductor wafer; thereafter bonding the surface of the first semiconductor wafer into which the ions have been implanted and a surface of the second semiconductor wafer with the insulator film or films interposed therebetween to form a bonded semiconductor wafer; heat treating the bonded semiconductor wafer, thereby the first semiconductor wafer being separated from the bonded semiconductor wafer at a micro-bubble layer formed by the implantation of hydrogen ions or rare gas ions.

In the first aspect, while an implantation depth of hydrogen ions or rare gas ions is required to be deeper than that of oxygen ions, there is no specific limitation as to which of both of the ion implantation steps is to be first performed.

A second aspect of a manufacturing process for a bonded semiconductor wafer of the present invention comprises the steps of: preparing first and second semiconductor wafers on one or both of which an insulator film or insulator films are formed; implanting oxygen ions into one surface of the first semiconductor wafer; implanting hydrogen ions or rare gas ions into one surface of the second semiconductor wafer; bonding the surface of the first semiconductor wafer and the surface of the second semiconductor wafer into each of which the ions have been implanted with the insulator film or films interposed therebetween to form a bonded semiconductor wafer; and heat treating the bonded semiconductor wafer, thereby the second semiconductor wafer being separated from the bonded semiconductor wafer at a micro-bubble layer formed by the implantation of hydrogen ions or rare gas ions.

A third aspect of a manufacturing process for a bonded semiconductor wafer of the present invention comprises the steps of: preparing first and second semiconductor wafers on one or both of which an insulator film or insulator films are formed; implanting oxygen ions into one surface of the first semiconductor wafer; thereafter heat treating the first semiconductor wafer to make an oxygen ion implanted layer of good film quality; further implanting hydrogen ions or rare gas ions into the one surface of the first semiconductor wafer; thereafter bonding the one surface of the first semiconductor wafer into which the ions have been implanted and a surface of the second semiconductor wafer with the insulator film or films interposed therebetween to form a bonded semiconductor wafer; and heat treating the bonded semiconductor wafer, thereby the first semiconductor wafer being separated from the bonded semiconductor wafer at a micro-bubble layer formed by the implantation of hydrogen ions or rare gas ions.

While the third aspect is a modification of the first aspect, wherein an SOI wafer is once manufactured by means of a so-called SIMOX (Separation by IMplanted OXygen) method and thereafter hydrogen ions are implanted on the SOI wafer, the subsequent steps being performed.

BEST MODE FOR THE CARRYING OUT THE INVENTION

Figure 1:
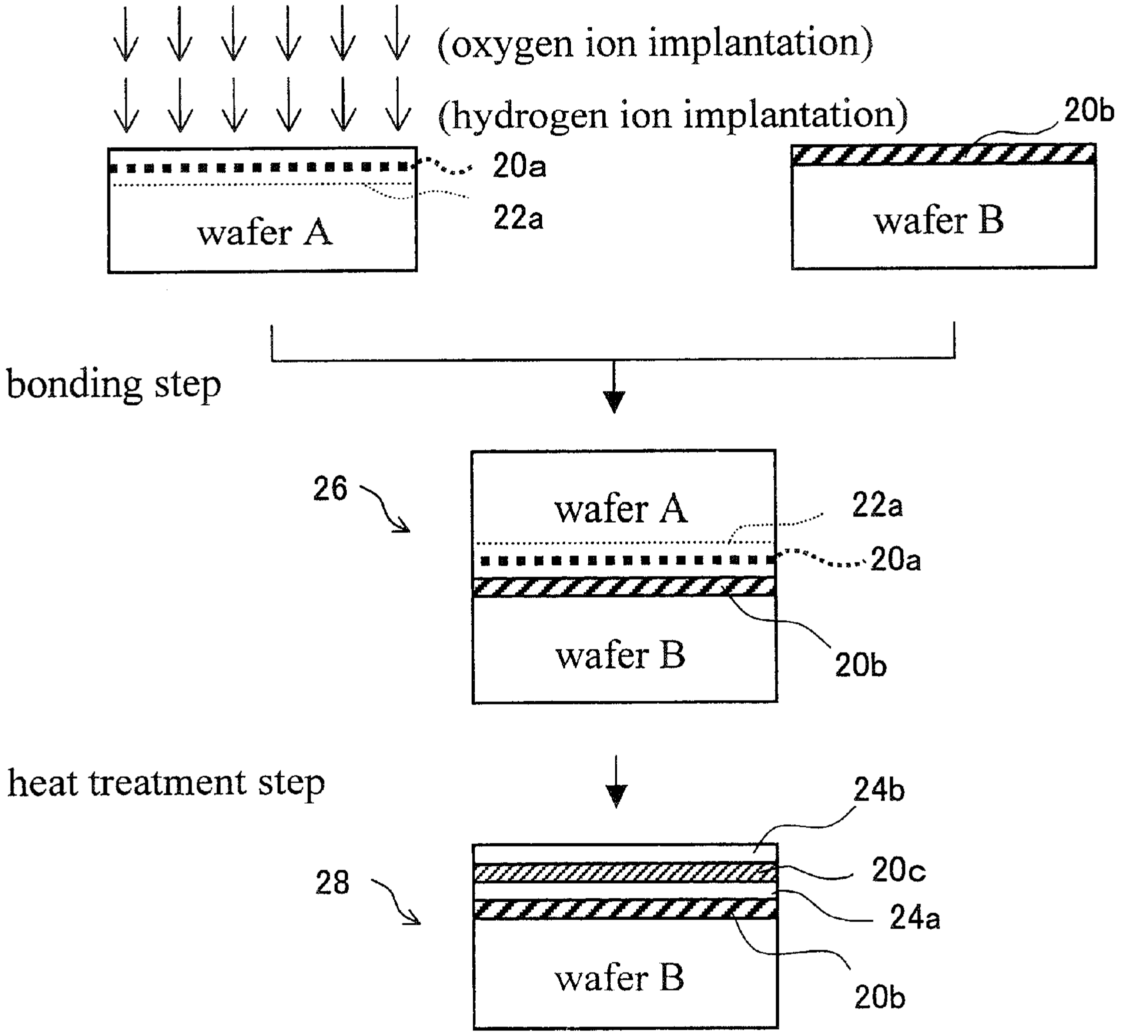
FIG. 1 is a flow chart showing a first embodiment of a manufacturing process for a bonded semiconductor wafer of the present invention.
Figure 2:
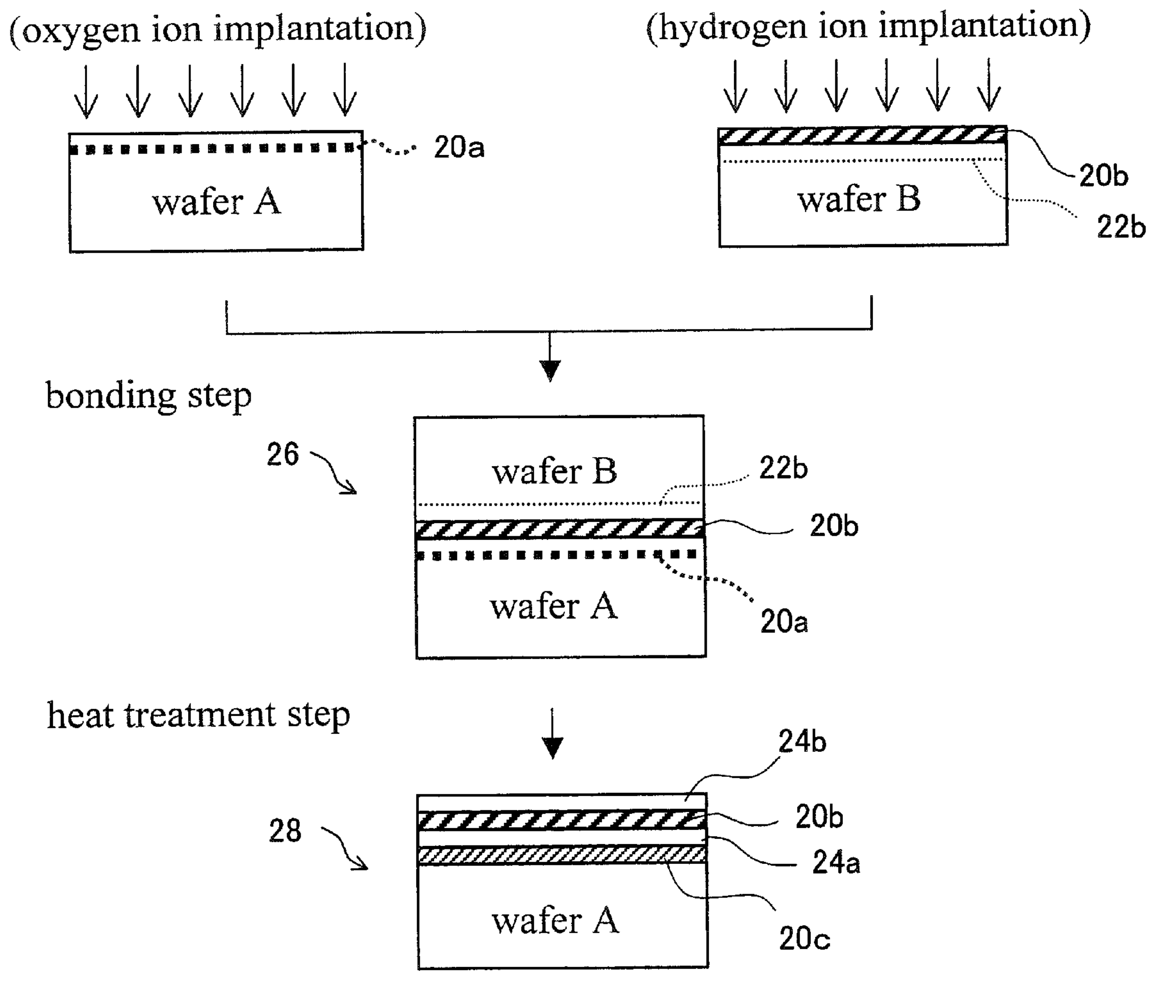
FIG. 2 is a flow chart showing a second embodiment of a manufacturing process for a bonded semiconductor wafer of the present invention.
Figure 3:
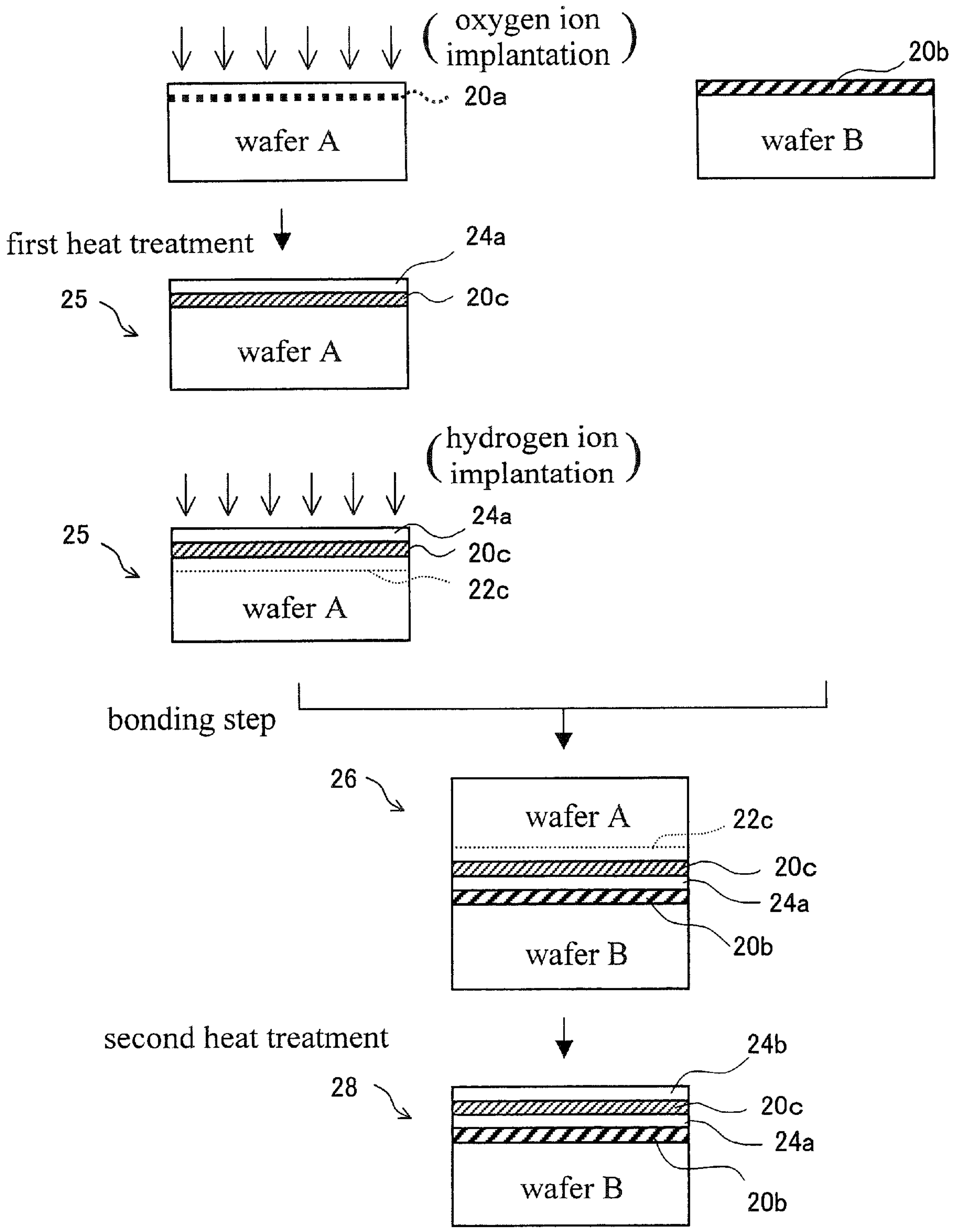
FIG. 3 is a flow chart showing a third embodiment of a manufacturing process for a bonded semiconductor wafer of the present invention.

Description will be given of embodiments of the present invention taking up an SOI wafer having a two cycle layered structure as an example below on the basis of FIGS. 1 to 3 among the accompanying drawings. It is needless to say that various modifications or alterations of the embodiments can be carried out as far as not departing from the technical concept of the present invention. FIG. 1 is a flow chart showing a first embodiment of a manufacturing process for a bonded semiconductor wafer of the present invention. FIG. 2 is a flow chart showing a second embodiment of a manufacturing process for a bonded semiconductor wafer of the present invention. FIG. 3 is a flow chart showing a third embodiment of a manufacturing process for a bonded semiconductor wafer of the present invention.

In the first embodiment of the present invention shown in FIG. 1, first of all, a first semiconductor wafer A (for example, a silicon wafer) having no insulator film and a second semiconductor wafer B (for example, a silicon wafer) having an insulator film or an insulator layer (for example, an oxide film) 20*b* are prepared. Two kinds of ions, oxygen ions and hydrogen ions (or rare gas ions), are implanted into the wafer A. By these ion implantation steps, an oxygen ion implanted layer 20*a* and a hydrogen ion implanted layer (a micro-bubble layer) 22*a* are formed in the interior of the wafer A. In this case, while an implantation depth of hydrogen ions (or rare gas ions) is required to be deeper than that of oxygen ions, there is no specific limitation as to which of both of the ion implantation steps is to be first performed.

Then, the ion implanted wafer A is bonded to the wafer B with the insulator layer 20*b* interposed therebetween to form a bonded wafer 26. This bonding step is to be performed in a clean atmosphere at room temperature. After that, the bonded wafer 26 is heat treated. By this heat treatment, the oxygen implanted layer 20*a* is changed to an oxide film layer, that is, an insulator layer 20*c*, and a portion of the wafer A is separated from the bonded wafer 26 at the hydrogen ion implanted layer (a micro-bubble layer) 22*a*. By this separation, there is manufactured a bonded semiconductor wafer having a two cycle layered structure (the insulator layer 20*b*, a semiconductor layer 24*a*, the insulator layer 20*c* and a semiconductor layer 24*b*), that is, an SOI wafer 28 having the two cycle layered structure.

When the bonded wafer 26 is heat treated, low temperature heat treatment at temperature on the order of 400 to 600° C. is sufficient if the heat treatment is performed only for the purpose of separation of the first wafer A, but in order to make the oxygen ion implanted layer 20*a* and the SOI layer adjacent thereto good in quality, heat treatment at temperature of 1300° C. or higher is usually required. Therefore, the film quality improving heat treatment and the separation heat treatment can be concurrently performed in high temperature heat treatment, omitting the low temperature separation heat treatment. In the embodiment of FIG. 1, there is shown the case where the oxygen ion implanted layer 20*a* is changed to an oxide film layer (an insulator layer) 20*c*.

Figure 4:
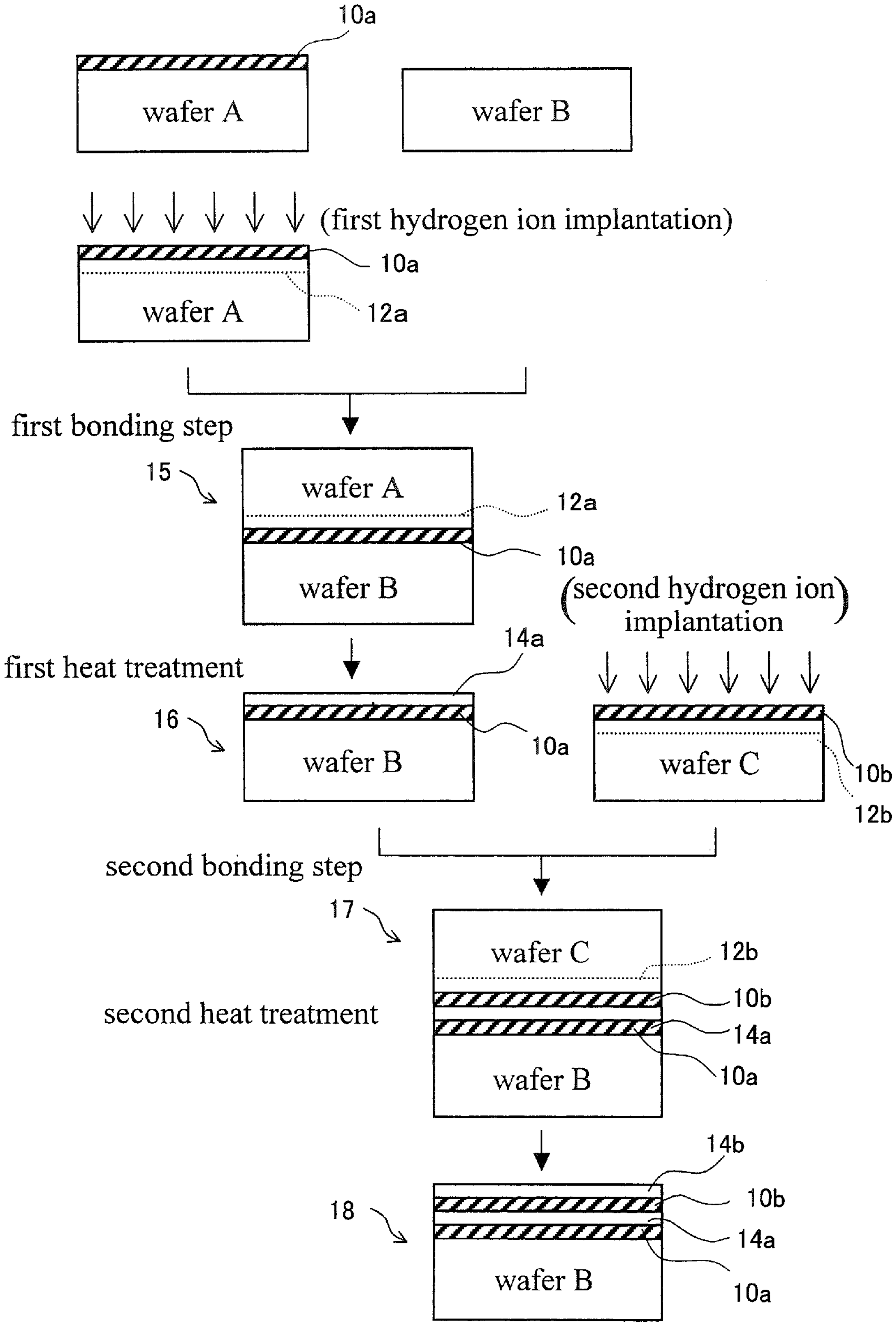
FIG. 4 is a flow chart showing an example of a prior art manufacturing process for a bonded semiconductor wafer.
Figure 5:
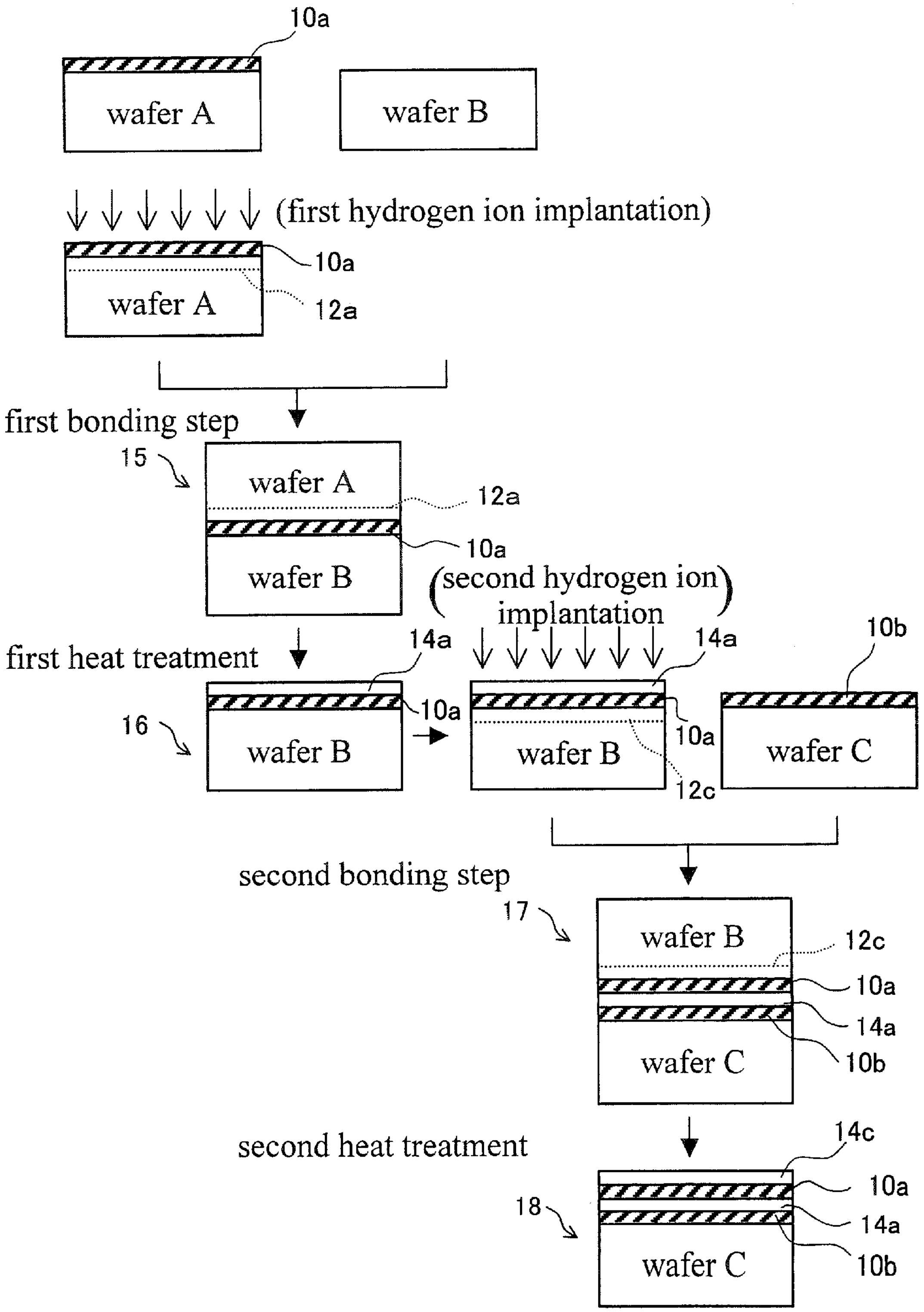
FIG. 5 is a flow chart showing another example of a prior art manufacturing process for a bonded semiconductor wafer.

According to the first embodiment shown in FIG. 1, compared with the prior art processes shown in FIGS. 4 and 5, only one bonding step is required and the number of heat treatment steps can also be reduced; therefore, a manufacturing process becomes simpler and more convenient and defective products in the bonding step can be reduced.

In the second embodiment of the present invention shown in FIG. 2, similar to the case of FIG. 1, first of all, a first semiconductor wafer A (for example, a silicon wafer) having no insulator film and a second semiconductor wafer B (for example, a silicon wafer) having an insulator film or an insulator layer (for example, an oxide film) 20*b* are prepared. Oxygen ions are implanted into the wafer A to form an oxygen implanted layer 20*a* in the interior thereof. Hydrogen ions (or rare gas ions) are implanted into the wafer B to form an hydrogen ion implanted layer (a micro-bubble layer) 22*a* in the interior thereof.

Then, the wafer A implanted with oxygen ions is bonded to the wafer B implanted with hydrogen ions with the insulator film 20*b* interposed therebetween to form a bonded wafer 26. Following to this, the bonded wafer 26 is heat treated. By this heat treatment, the oxygen ion implanted layer 20*a* is changed to an oxide layer, that is, an insulator layer 20*c*, and a portion of the wafer B is also separated from the bonded wafer 26 at the hydrogen ion implanted layer (the micro-bubble layer) 22*b*. By this separation, there is manufactured a bonded semiconductor wafer having a two cycle layered structure (the insulator layer 20*c*, a semiconductor layer 24*a*, the insulator layer 20*b* and a semiconductor layer 24*b*), that is, an SOI wafer 28 having the two cycle layered structure.

According to the second embodiment shown in FIG. 2 as well, only one bonding step is required and the number of heat treatment steps can also be reduced; therefore, a manufacturing process becomes simpler and more convenient and defective products in the bonding step can be reduced.

The third embodiment of the present invention shown in FIG. 3 is a modification of FIG. 1, and similar to the case of FIG. 1, first of all, a first semiconductor wafer A (for example, a silicon wafer) having no insulator film and a second semiconductor wafer B (for example, a silicon wafer) having an insulator film or an insulator layer (for example, an oxide film) 20*b* are prepared. Oxygen ions are implanted into the wafer A to form an oxygen ion implanted layer 20*a* in the interior thereof, and thereafter high temperature heat treatment is applied thereto to form an SOI wafer 25 having a one cycle layered structure (an insulator layer 20*c* and a semiconductor layer 24*a*). That is, an SOI wafer according to the so-called SIMOX (Separation by IMplanted OXygen) method is once manufactured and thereafter, hydrogen ions are implanted on the SOI wafer, followed by the below described steps.

Hydrogen ions (or rare gas ions) are implanted into the SOI wafer 25 in which the one cycle layered structure is formed to form a hydrogen ion implanted layer (a micro-bubble layer) 22*c* in the interior thereof. Then, the SOI wafer 25 thus implanted with hydrogen ions is bonded to the wafer B with an insulator film 20*b* interposed therebetween to form a bonded wafer 26.

Then, the bonded wafer 26 is heat treated and thereby, a portion of the wafer A is separated from the bonded wafer 26 at a hydrogen ion implanted layer (a micro-bubble layer) 22*c*. By this separation, there is provided a bonded semiconductor wafer having a two cycle layered structure (the insulator layer 20*b*, a semiconductor layer 24*a*, the insulator layer 20*c* and a semiconductor layer 24*b*), that is, an SOI wafer 28 having the two cycle layered structure.

In the third embodiment of the present invention shown in FIG. 3, only one bonding step is required; therefore, a manufacturing process becomes simpler and more convenient and defective products in the bonding step can also be reduced.

Note that while in each of FIGS. 1 to 3, the insulator film or the insulator layer (for example, an oxide film) 20*b* prior to the bonding is formed on the wafer B, the insulator film 20*b* may be formed on either surface or both surfaces of the A and B wafers.

Furthermore, a layered structure of 3 cycles or more can be obtained by the following procedures; for example, a hydrogen ion implanted wafer (a wafer similar to the wafer B of FIG. 2) separately prepared is bonded to the surface of the SOI wafer 28 having a two cycle layered structure obtained according to any of the manufacturing processes of FIGS. 1 to 3 and then separation heat treatment step is successively performed, or SOI wafers having multi-cycle layered structure are bonded together at respective surfaces thereof with the insulator film interposed therebetween.

EXAMPLES

Description will be given of the present invention taking up examples and needless to say that the examples should not be construed by way of limitation.

Example 1

Two silicon wafers of 200 mm in diameter and a <100> orientation were prepared. A bonded semiconductor wafer having a two cycle layered structure was manufactured according to the flow chart shown in FIG. 2 and under manufacturing conditions shown in Table 1. Results of the manufacture are shown in Table 1 as well. As shown in the results of the manufacture of Table 1, there was manufactured a bonded semiconductor wafer having a two cycle layered structure of good performance.

TABLE 1

| | Wafer A | Wafer B |
|---|---|---|
| Surface oxide film | none | 100 nm |
| Implanted ion | oxygen ion ($O^+$) | hydrogen ion ($H^+$) |
| Implantation energy | 180 keV | 35 keV |
| Dose | $4 \times 10^{17}/cm^2$ | $8 \times 10^{16}/cm^2$ |
| Heat treatment | 1350° C., 4 hours | |
| Manufactured two cycle layered structure | surface SOI layer: 200 nm<br>upper oxide film: 100 nm<br>interior SOI layer: 300 nm<br>lower oxide film: 80 nm<br>(oxygen ion implanted oxide film) | |

Furthermore, other bonded semiconductor wafers each having a two cycle layered structure were likewise manufactured according to the flow charts shown in FIGS. 1 and 3, and bonded semiconductor wafers each having good performance were obtained.

Capability of Exploitation in Industry

According to the present invention, as described above, there can be provided a novel bonded semiconductor wafer having a layered structure alternately stacked with semiconductor layers and insulator layers in two cycles or more, and manufactured by means of a bonding process, wherein at least one of insulator layers is formed with ion implanted oxygen. Further, according to a manufacturing process of a bonded semiconductor wafer of the present invention, an ion implantation separation process is adopted, thereby enabling simplification of a manufacturing procedure and reduction of defective products in a bonding step.

What is claimed is:

1. A bonded semiconductor wafer manufactured by means of a bonding process and having a layered structure alternately stacked with continuous layers formed over the entire surface of one side of the wafer, wherein said layers comprise semiconductor layers and insulator layers in two cycles or more, wherein at least one of the insulator layers is formed with ion implanted oxygen.

2. The bonded semiconductor wafer according to claim 1, wherein the semiconductor layers are of silicon and the insulator layers are of silicon oxide films, and the number of cycles of the layered structure is 2.

3. A manufacturing process for a bonded semiconductor wafer, comprising the steps of:

preparing first and second semiconductor wafers on one or both of which an insulator film or insulator films are formed as a continuous layer or layers formed over the entire surface of one side of each of the wafers;

implanting oxygen ions and hydrogen or rare gas ions into one surface of the first semiconductor wafer;

thereafter bonding the surface of the first semiconductor wafer into which the ions have been implanted and a surface of the second semiconductor wafer with the insulator film or films interposed therebetween to form a bonded semiconductor wafer; and heat treating the bonded semiconductor wafer, thereby the first semiconductor wafer being separated from the bonded semiconductor wafer at a micro-bubble layer formed by the implantation of hydrogen ions or rare gas ions.

4. A manufacturing process for a bonded semiconductor wafer, comprising the steps of:

preparing first and second semiconductor wafers on one or both of which an insulator film or insulator films are formed as a continuous layer or layers formed over the entire surface of one side of each of the wafers;

implanting oxygen ions into one surface of the first semiconductor wafer;

implanting hydrogen ions or rare gas ions into one surface of the second semiconductor wafer;

bonding the surface of the first semiconductor wafer and the surface of the second semiconductor wafer into each of which the ions have been implanted with the insulator film or films interposed therebetween to form a bonded semiconductor wafer; and heat treating the bonded semiconductor wafer, thereby the second semiconductor wafer being separated from the bonded semiconductor wafer at a micro-bubble layer formed by the implantation of hydrogen ions or rare gas ions.

5. A manufacturing process for a bonded semiconductor wafer, comprising the steps of:

preparing first and second semiconductor wafers on one or both of which an insulator film or insulator films are formed as a continuous layer or layers formed over the entire surface of one side of each of the wafers;

implanting oxygen ions into one surface of the first semiconductor wafer to form an oxygen ion implanted layer;

thereafter heat treating the first semiconductor wafer to change the oxygen ion implanted layer to an oxide film layer;

further implanting hydrogen ions or rare gas ions into the surface of the first semiconductor wafer;

thereafter bonding the surface of the first semiconductor wafer into which the ions have been implanted and a surface of the second semiconductor wafer with the insulator film or films interposed therebetween to form a bonded semiconductor wafer; and heat treating the bonded semiconductor wafer, thereby the first semiconductor wafer being separated from the bonded semiconductor wafer at a micro-bubble layer formed by the implantation of hydrogen ions or rare gas ions.

* * * * *